United States Patent
Nakamura

(10) Patent No.: US 11,522,505 B2
(45) Date of Patent: Dec. 6, 2022

(54) SEMICONDUCTOR INTEGRATED CIRCUIT AND RECEIVER DEVICE

(71) Applicant: Kioxia Corporation, Tokyo (JP)

(72) Inventor: Yutaka Nakamura, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 141 days.

(21) Appl. No.: 17/016,615

(22) Filed: Sep. 10, 2020

(65) Prior Publication Data

US 2021/0288618 A1 Sep. 16, 2021

(30) Foreign Application Priority Data

Mar. 16, 2020 (JP) .............................. JP2020-045359

(51) Int. Cl.
*H03F 3/19* (2006.01)
*H03F 3/195* (2006.01)
*H03G 5/16* (2006.01)

(52) U.S. Cl.
CPC .............. *H03F 3/195* (2013.01); *H03G 5/165* (2013.01); *H03F 2200/375* (2013.01); *H03G 2201/103* (2013.01); *H03G 2201/307* (2013.01)

(58) Field of Classification Search
CPC ...................................................... H03F 3/195
See application file for complete search history.

(56) References Cited

U.S. PATENT DOCUMENTS

| | | | | |
|---|---|---|---|---|
| 6,631,103 B1* | 10/2003 | Yamanoi | .......... | G11B 20/10009 369/47.28 |
| 9,620,101 B1* | 4/2017 | Thandri | .......... | G10K 11/17833 |
| 10,476,706 B2 | 11/2019 | Kitazawa | | |
| 2002/0172112 A1* | 11/2002 | Shoji | ................... | H03M 1/0607 |
| 2007/0164802 A1* | 7/2007 | Rea | ......................... | H03F 3/505 327/266 |
| 2010/0142606 A1 | 6/2010 | Kato | | |
| 2019/0052488 A1 | 2/2019 | Fujii et al. | | |
| 2022/0065901 A1* | 3/2022 | Desai | ................. | H03F 3/45748 |

FOREIGN PATENT DOCUMENTS

| | | |
|---|---|---|
| JP | 2009-55306 A | 3/2009 |
| JP | 2010-141527 A | 6/2010 |
| JP | 2013-162146 A | 8/2013 |
| JP | 2019-33476 A | 2/2019 |
| JP | 2019-169827 A | 10/2019 |

* cited by examiner

*Primary Examiner* — Patricia T Nguyen
(74) *Attorney, Agent, or Firm* — Oblon, McClelland, Maier & Neustadt, L.L.P.

(57) ABSTRACT

A semiconductor integrated circuit includes an equalizer circuit configured to amplify a signal component in a particular frequency band of an input signal on a signal path after a coupling capacitor, a sampler circuit configured to convert a first signal outputted from the equalizer circuit to a digital signal, a detector circuit configured to output a second signal based on a frequency of appearance of two values included in the digital signal, and a compensator circuit configured to compensate for a shift of a DC voltage level on the signal path after the coupling capacitor based on the second signal outputted from the detector circuit.

20 Claims, 8 Drawing Sheets

2: RECEIVER DEVICE

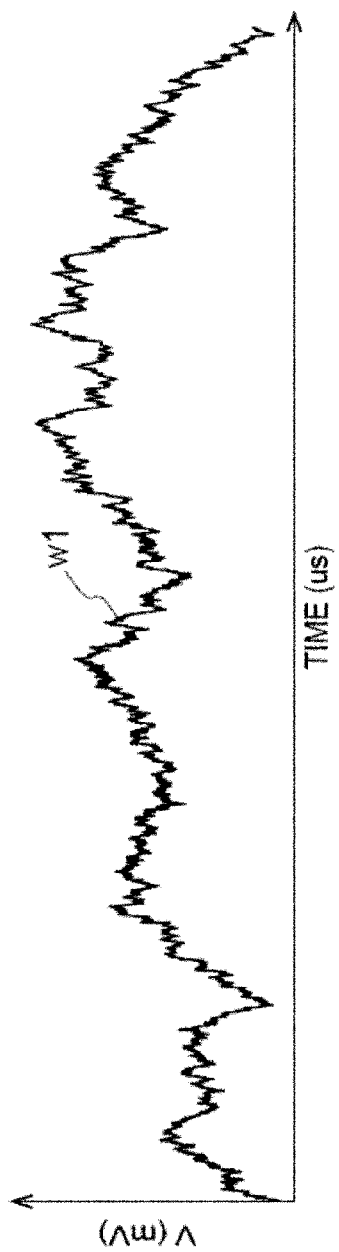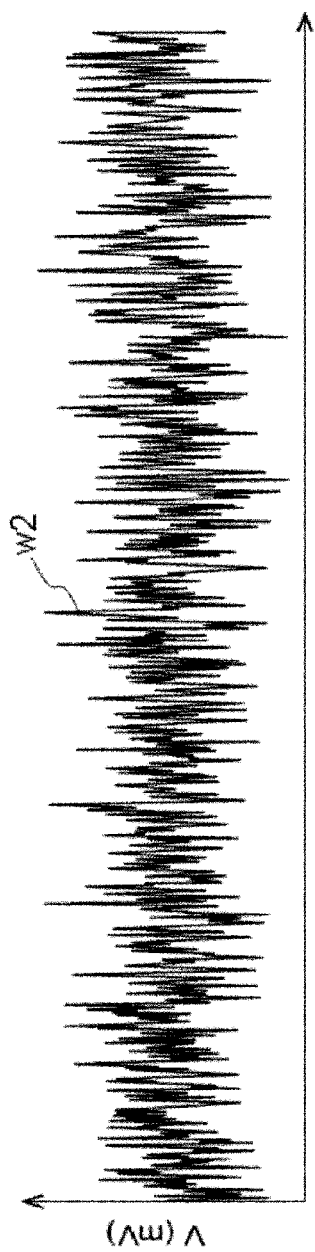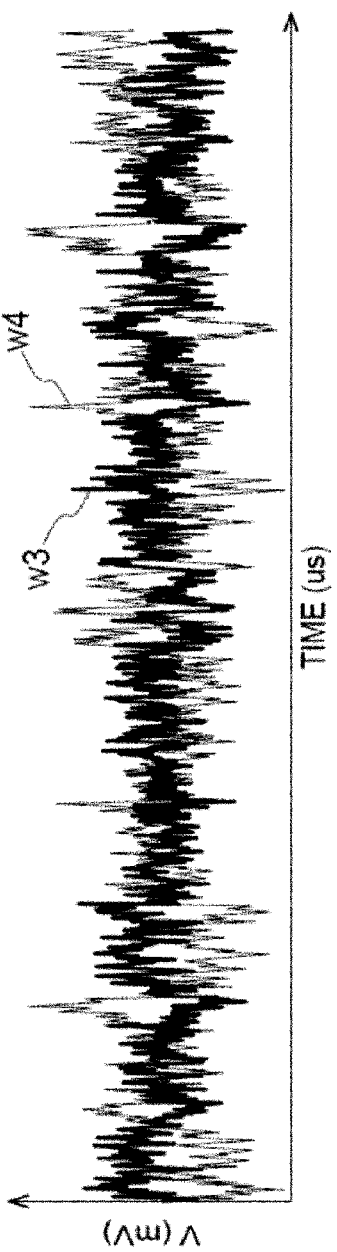

SEMICONDUCTOR INTEGRATED CIRCUIT AND RECEIVER DEVICE

CROSS REFERENCE TO RELATED APPLICATIONS

This application is based upon and claims the benefit of priority from the prior Japanese Patent Application No. 2020-45359, filed on Mar. 16, 2020, the entire contents of which are incorporated herein by reference.

FIELD

Embodiments described herein relate generally to semiconductor integrated circuits and receiver devices.

BACKGROUND

The amount of data used with by electronic apparatuses such as smartphones and personal computers is increasing year after year. As a result, a demand is increasing for a circuit technology for transmitting a large amount of data at a high speed with a low power consumption. High-speed transmission circuits often transmit and receive differential signals for reducing noise. In some cases, coupling capacitors are inserted to signal paths for transmitting differential signals to cut off a DC voltage component during the signal transmission.

Insertion of the coupling capacitors on the signal paths through which the differential signals are transmitted may change the DC voltage level of the signal paths after the coupling capacitors. For example, the DC voltage level may differ among a case where the number of 0s and the number of 1s in the data of the differential signals are the same, a case where the number of 1s is greater than the number of 0s, and a case where the number of 0s is greater than the number of 1s.

Therefore, differential signals passing through coupling capacitors and inputted to an equalizer, for example, may not be normally processed by the equalizer due to fluctuations in the DC voltage level of the differential signals, and the operation of the equalizer may become unstable and the amplitude of the output signal of the equalizer may become higher or lower than a desired amplitude.

BRIEF DESCRIPTION OF THE DRAWINGS

FIGS. 5A to 5C are voltage waveform diagrams showing simulation results of the semiconductor integrated circuit.

DETAILED DESCRIPTION

In order to solve the above-described problem, a semiconductor integrated circuit according to an embodiment of the present invention includes:

an equalizer circuit configured to amplify a signal component in a particular frequency band of an input signal on a signal path after a coupling capacitor;

a sampler circuit configured to convert a first signal outputted from the equalizer circuit to a digital signal;

a detector circuit configured to output a second signal based on a frequency of appearance of two values included in the digital signal; and a compensator circuit configured to compensate for a shift of a DC voltage level on the signal path after the coupling capacitor based on the second signal outputted from the detector circuit.

Embodiments of semiconductor integrated circuits and receiver devices will now be described with reference to the accompanying drawings. The following descriptions mainly explain major constituent elements of semiconductor integrated circuits and receiver devices. However, the semiconductor integrated circuits and the receiver devices may have other elements or functions that are not illustrated or explained. The following descriptions are not intended to exclude any element or function that is not illustrated or explained.

First Embodiment

Figure 1:
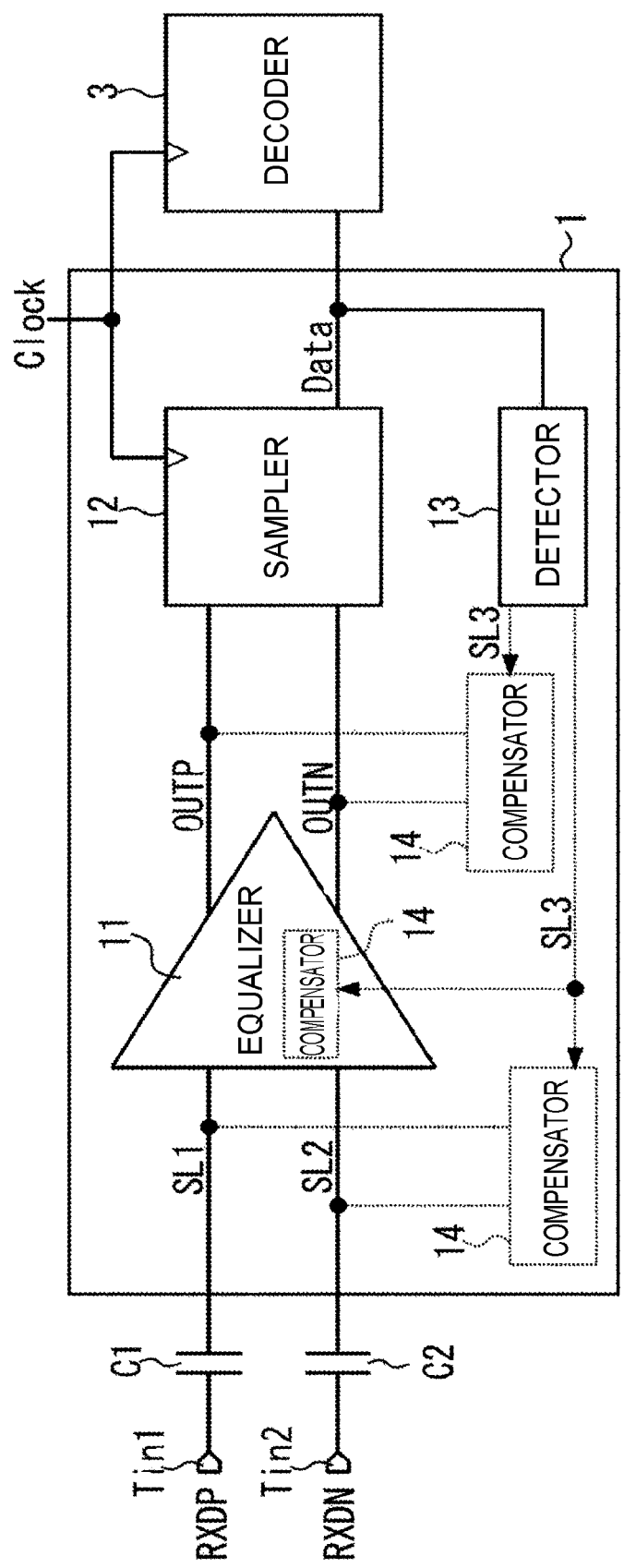
FIG. 1 is a block diagram illustrating a schematic configuration of a receiver device including a semiconductor integrated circuit according to a first embodiment.

FIG. 1 is a block diagram illustrating a schematic configuration of a receiver device 2 including a semiconductor integrated circuit 1 according to a first embodiment. The receiver device 2 shown in FIG. 1 is capable of receiving differential signals at a high speed. The receiver device 2 shown in FIG. 1 may be housed in a package, or mounted on a printed board.

The receiver device 2 shown in FIG. 1 includes a first input terminal Tin1 and a second input terminal Tin2, a first coupling capacitor C1 and a second coupling capacitor C2, a semiconductor integrated circuit 1, and a decoder 3. The first coupling capacitor C1 and the second coupling capacitor C2 may be externally connected to the semiconductor integrated circuit 1 or included in the semiconductor integrated circuit 1. The semiconductor integrated circuit 1 and the decoder 3 may be arranged on a single semiconductor chip housed in a package.

Differential input signals RXDP and RXDN are inputted to the first input terminal Tin1 and the second input terminal Tin2, respectively. The "differential input signals" here means signals having opposite phases. The input signals are transmitted in a differential manner to compensate for the common mode noise superimposed on the signal waveforms. Since the differential input signals may be transmitted at low amplitude levels, the power consumption may be reduced.

The first coupling capacitor C1 is disposed on a first signal path SL1 connecting the first input terminal Tin1 and the semiconductor integrated circuit 1. The second coupling capacitor C2 is disposed on a second signal path SL2 connecting the second input terminal Tin2 and the semiconductor integrated circuit 1.

As will be described later, the semiconductor integrated circuit 1 converts the differential input signals to a digital signal that is in synchronization with a clock signal. The digital signal outputted from the semiconductor integrated circuit 1 is inputted to the decoder 3. The differential input signals received by the receiver device 2 include analog signals corresponding to data encoded in accordance with a predetermined encoding method. The decoder 3 performs a decoding process according to a decoding method corresponding to the encoding method on the inputted digital signal to restore the data before being encoded.

The semiconductor integrated circuit 1 includes an equalizer 11, a sampler 12, a detector 13, and a compensator 14. These components are configured as circuits. The respective components included in the semiconductor integrated circuit 1 are connected to one another and arranged on one or more semiconductor substrates.

The equalizer 11 amplifies a signal component in a predetermined frequency band included in the differential input signals on the signal paths after the coupling capacitors. In general, the gain of an amplifier decreases as the frequency increases. The equalizer 11 considerably amplifies the signal component in the predetermined frequency band, and therefore may broaden the frequency range in which no signal attenuation occurs. The equalizer 11 thus functions as a band-pass filter. Specific examples of the equalizer 11 according to the first embodiment includes a continuous time linear equalizer (CTLE) that linearly amplifies the signal component in the predetermined frequency band included in the differential input signals on the first signal path SL1 and the second signal path SL2 after the first coupling capacitor C1 and the second coupling capacitor C2.

The sampler 12 converts output signals (first signal) from the equalizer 11 to a digital signal. In more detail, the sampler 12 outputs a digital signal corresponding to the data included in the differential input signals in synchronization with a clock signal that is extracted from the differential output signals from the equalizer 11. The sampler 12 detects a reference voltage level based on the differential output signals outputted from the equalizer 11, and generates a digital signal including a value of 1 when the values of the differential output signals are equal to or higher than the reference voltage level by a predetermined threshold voltage value, and a value of 0 when they are lower than the predetermined threshold voltage value.

The detector 13 outputs a signal (second signal) based on the frequency of appearance of two values in the digital signal. More specifically, the detector 13 outputs an analog signal SL3 to the compensator 14, the analog signal SL3 indicating whether or not the two values evenly appear in the digital signal. The signal amplitude of the analog signal indicates the state of the balance between the number of 1s and the number of 0s in the digital signal. The balance between the numbers means whether the difference between the numbers is small or great. If the difference is considerably great, the difference between the number of 0s and the number of 1s in the data of the differential input signals is also considerably great. In this case, DC voltage level of each of the differential input signals on the first signal path SL1 and the second signal path SL2 may be considerably different from a desired reference voltage level. In order to deal with this problem, the detector 13 and the compensator 14 are provided in this embodiment. Since the equalizer 11 amplifies both the signal component in the predetermined frequency band and the DC voltage level of the differential input signals, if the DC voltage level varies, the equalizing process may not be performed normally. This may lead to an increase or a decrease in the amplitude of the output signal from the equalizer 11 as compared with an expected value.

The compensator 14 compensates for a shift of the DC voltage level of the signals on the signal paths after the coupling capacitors when the difference in the frequency of appearance between the two values in the digital signal is greater than a predetermined threshold value. When the output signal from the detector 13 indicates a first level, the compensator 14 compensates for the shift of the DC voltage level of the signals on the first signal path SL1 and the second signal path SL2 after the first coupling capacitor C1 and the second coupling capacitor C2. The shift of the DC voltage level is a shift of the differential input signals on the first signal path SL1 and the second signal path SL2 from the reference voltage level that is obtained when the number of 0s and the number of 1s in the digital signal are the same. Basically, the differential input signals RXDP and RXDN inputted to the first input terminal Tin1 and the second input terminal Tin2 are encoded with a predetermined encoding method so that the number of 0s and the number of 1s in the digital signal are the same.

Three blocks each surrounded by a broken line in FIG. 1 indicates portions where the compensator 14 may possibly be located. As shown in FIG. 1, the compensator 14 may be placed in one of the three blocks, i.e., may be connected to the first signal path SL1 and the second signal path SL2, or included in the equalizer 11, or connected to the output nodes OUTP and OUTN of the equalizer 11. FIG. 1 only shows examples of the location of the compensator 14. The compensator 14 may be disposed to a location other than those shown in FIG. 1. For example, a DC offset canceller for the output signals from the equalizer 11 may have a function of the compensator 14, as will be described later. In any case, the compensator 14 may compensate for the shift of the DC voltage level on the signal paths after the first coupling capacitor C1 and the second coupling capacitor C2.

If the compensator 14 is connected to the first signal path SL1 and the second signal path SL2, the DC voltage level of the first signal path SL1 and the second signal path SL2 may be adjusted by controlling charging and the discharging of the first coupling capacitor C1 and the second coupling capacitor C2 based on the output signal from the detector 13.

Figure 2:
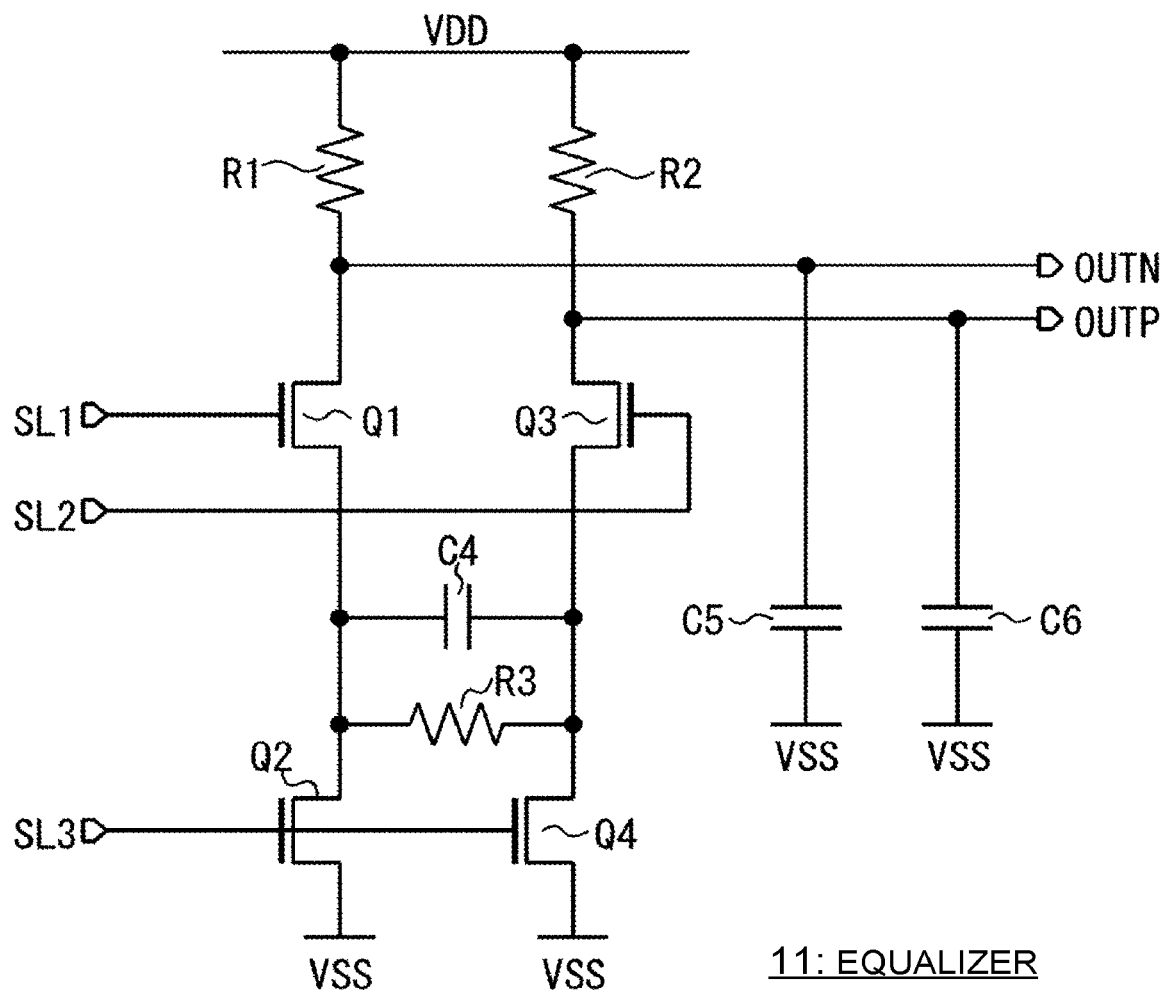
FIG. 2 is a circuit diagram illustrating an example of an internal configuration of an equalizer.

FIG. 2 is a circuit diagram illustrating an example of the internal configuration of the equalizer 11 including the compensator 14. The equalizer 11 shown in FIG. 2 includes NMOS transistors Q1 to Q4, resistors R1 to R3, and capacitors C4 to C6. The transistors Q2 and Q4 shown in FIG. 2 function as a major part of the compensator 14.

The transistors Q1 and Q2 are cascade-connected between the second output node OUTN and a ground node VSS. The transistors Q3 and Q4 are cascade-connected between the first output node OUTP and the ground node. The resistor R1 is connected between a power supply voltage node VDD and the second output node OUTN. The resistor R2 is connected between the power supply voltage node VDD and the first output node OUTP. The capacitor C4 and the resistor R3 are connected in parallel with each other between a source of the transistor Q1 (a drain of the transistor Q2) and a source of the transistor Q3 (a drain of the transistor Q4). A gate of the transistor Q1 is connected to the first signal path SL1, and a gate of the transistor Q3 is connected to the second signal path SL2.

To gates of the transistor Q2 and the transistor Q4, which serve as the compensator 14, is inputted the output signal SL3 of the detector 13. Current flowing between the drain and the source of each of the transistor Q2 and the transistor Q4 may be adjusted according to the output signal SL3 from the detector 13. The DC voltage level of the first output node OUTP and the second output node OUTN may be adjusted in this manner.

Figure 3:
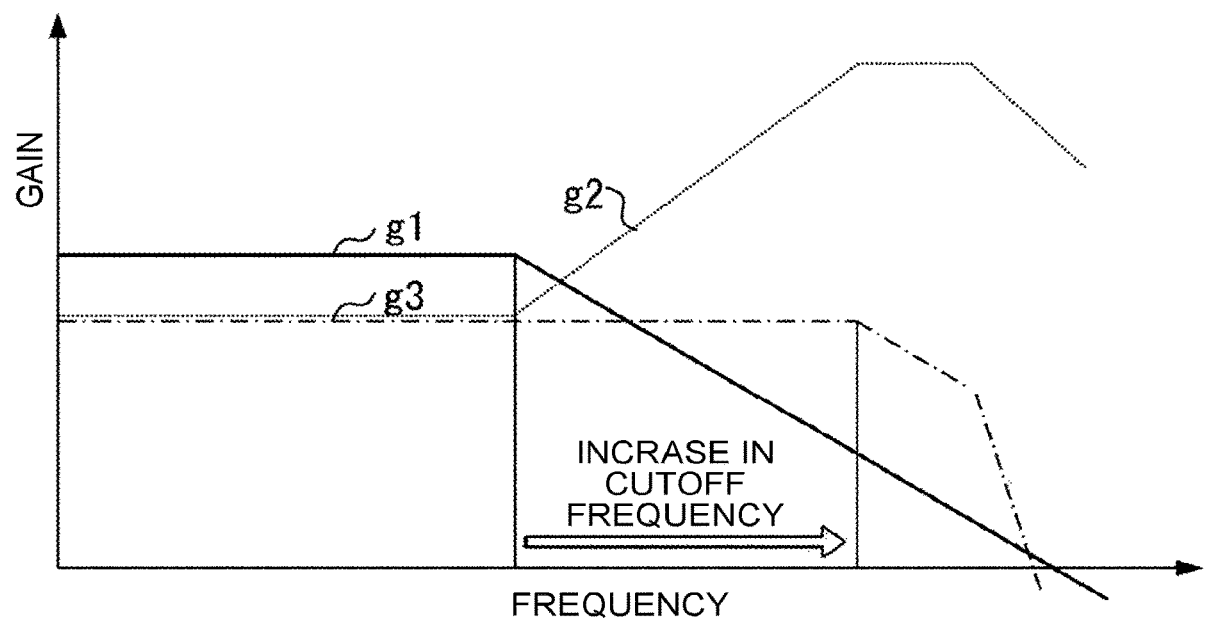
FIG. 3 is a graph for explaining a characteristic of the equalizer.

FIG. 3 is a graph for explaining a characteristic of the equalizer 11. A waveform g1 in FIG. 3 shows a transmission characteristic of the first signal path SL1 and the second signal path SL2. As the waveform g1 indicates, the differential input signals lose the high-frequency component when passing through the first signal path SL1 and the second signal path SL2.

A waveform g2 in FIG. 3 shows an equalization characteristic of the equalizer 11. The equalizer 11 has an equalization characteristic to increase the gain of a predetermined frequency band on the high frequency side. As a result, the gain linearly increases in the predetermined frequency band.

A waveform g3 in FIG. 3 shows a combined characteristic of the waveforms g1 and g2, and indicates the output signal characteristic of the equalizer 11. As illustrated in FIG. 3, the loss in high-frequency component of the differential input signals passing through the first signal path SL1 and the second signal path SL2 is compensated for by the equalization characteristic of the equalizer 11. As a result, ae cutoff frequency on the high frequency side may be higher as shown by the waveform g3. Thus, the gain may be maintained in a higher frequency band of the signals.

As described above, in the first embodiment, when the first coupling capacitor C1 and the second coupling capacitor C2 are arranged on the signal paths for differential input signals, fluctuations in the DC voltage level of the input signals in the first signal path SL1 from the first coupling capacitor C1 to the first input node of the equalizer 11 and the second signal path SL2 from the second coupling capacitor C2 to the second input node of the equalizer 11 may be curbed by providing the detector 13 and the compensator 14 to compensate for the DC voltage level of the differential input signals. More specifically, if there is a difference in the number of 0s and the number of 1s in the data of the differential input signals on the first signal path SL1 and the second signal path SL2, the DC voltage level of the differential input signals fluctuates. In order to deal with this, the detector 13 detects the balance between the number of 0s and the number of 1s in the digital signal, and the compensator 14 compensates for the shift of the DC voltage level in the differential input signals on the first signal path SL1 and the second signal path SL2 based on the detection results. Thus, a circuit configuration of the first embodiment is capable of cutting the DC component by means of the first coupling capacitor C1 and the second coupling capacitor C2, and stabilizing the output of the equalizer 11 even if the number of 0s and the number of 1s in the received differential input signals are not even.

FIG. 1 shows an example in which the sampler 12 generates the digital signal after the equalizer 11 performs the equalization process on the differential input signals. However, the sampler 12 may generate the digital signal after the equalizer 11 performs the equalization process on a single input signal instead of the differential signals. This also applies to the following embodiments.

Second Embodiment

The second embodiment represents a more specific example of the first embodiment, in which the compensator 14 is connected to the first signal path SL1 and the second signal path SL2.

Figure 4:
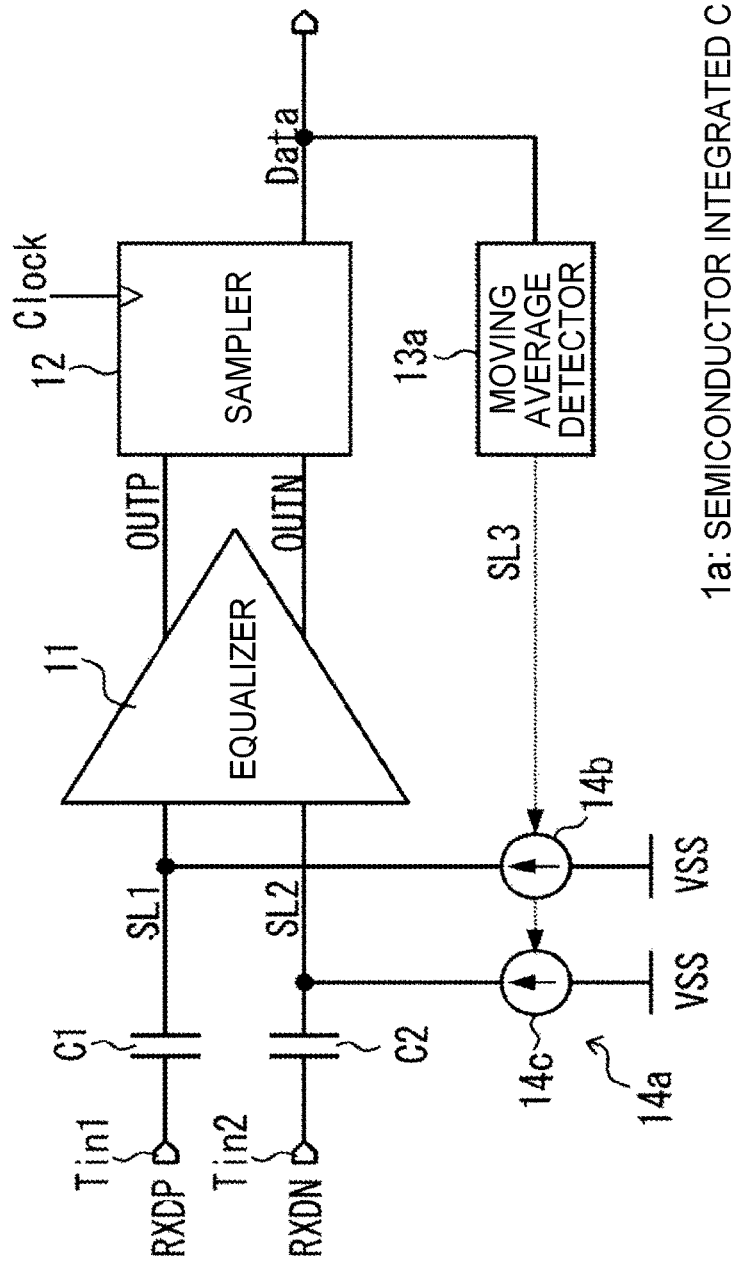
FIG. 4 is a block diagram illustrating a schematic configuration of a semiconductor integrated circuit according to a second embodiment.

FIG. 4 is a block diagram illustrating a schematic configuration of a semiconductor integrated circuit 1a according to the second embodiment. The semiconductor integrated circuit 1a shown in FIG. 4 includes a moving average detector 13a instead of the detector 13, and a bias circuit 14a instead of the compensator 14.

The moving average detector 13a detects the number of 0s and the number of 1s included in the digital signal and outputs a signal representing the moving average of the numbers. The moving average helps smoothing time-series data. Specifically, an average value of n time-series data values obtained at times near time t1 is regarded as the data at time t1, and an average value of n time-series data values obtained at times near time t2 is regarded as the data at time t2. The same process is repeated in every time unit to obtain a moving average. The output signal from the moving average detector 13a corresponds to smoothed data obtained by smoothing the time-series data at each time. The smoothed data may reflect the most-recently-obtained n time-series data values, and eliminate the influence of temporary data fluctuations caused by noise etc. The smoothed data may also reflect the characteristics of the time-series data in each period of time.

The bias circuit 14a includes a first current source 14b capable of adjusting a charging current and a discharging current of the first coupling capacitor C1 based on the output signal from the moving average detector 13a, and a second current source 14c capable of adjusting a charging current and a discharging current of the second coupling capacitor C2. The DC voltage level of the differential input signals on the first signal path SL1 and the second signal path SL2 may be caused to approach a desired level by adjusting the currents flowing through the first current source 14b and the second current source 14c based on the output signal from the moving average detector 13a. As a result, the operation of the equalizer 11 may be stabilized.

Figure 6:
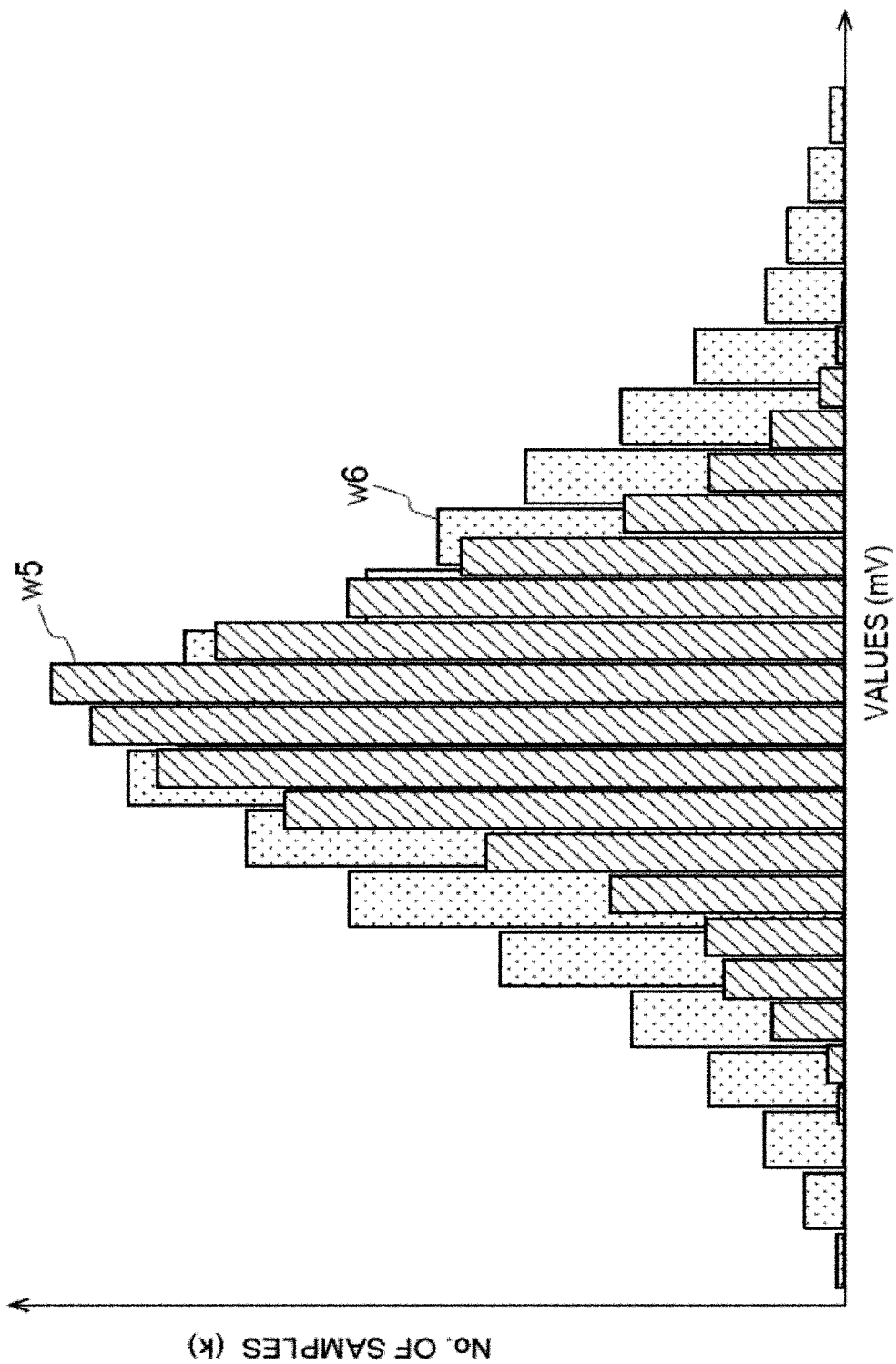
FIG. 6 is a diagram showing histograms of a simulation result of the semiconductor integrated circuit.

FIGS. 5A to 5C and 6 show a result of a simulation performed for the semiconductor integrated circuit la when the differential input signals are inputted to the semiconductor integrated circuit 1a shown in FIG. 4, the number of 0s and the number of 1s in the data of the differential input signals randomly fluctuating as time passes. In FIGS. 5A to 5C, the horizontal axis represents time [μs] and the vertical axis represents voltage [mV]. In FIG. 6, the horizontal axis represents voltage [mV], and the vertical axis represents the number of samples.

A waveform w1 in FIG. 5A shows a voltage signal representing the difference between the number of 0s and the number of 1s in the digital signal, which is called "running disparity." As can be understood from the waveform w1, the number of 0s and the number of 1s in the differential input signals are not always the same, but randomly fluctuate as the time passes. The waveform w1 shows, for example, that if the voltage [mV] is high, the number of 1s is greater than the number of 0s, and if the voltage [mV] is low, the number of 0s is greater than the number of 1s.

A waveform w2 in FIG. 5B shows a voltage signal representing the output signal from the moving average detector 13a. A bold-line waveform w3 in FIG. 5C shows the DC voltage level on the first signal path SL1 and the second signal path SL2 when the charging current and the discharging current of the first coupling capacitor C1 and the second coupling capacitor C2 are adjusted by using the moving average detector 13a and the bias circuit 14a. The waveform w3 indicates the characteristics of the second embodiment. A fine-line waveform w4 in FIG. 5C shows the DC voltage level on the first signal path SL1 and the second signal path SL2 when the moving average detector 13a and the bias circuit 14a are not provided. The waveform w4 indicates the characteristic of a comparative example of the second embodiment. As can be understood from a comparison between the waveform w3 and the waveform w4, the fluctuations of the DC voltage level on the first signal path SL1 and the second signal path SL2 may be curbed by adjusting the charging current and the discharging current of the first coupling capacitor C1 and the second coupling capacitor C2 by arranging the moving average detector 13a and the bias circuit 14a.

A histogram w5 in FIG. 6 shows the fluctuations of the DC voltage level on the first signal path SL1 and the second signal path SL2 when the charging current and the discharging current of the first coupling capacitor C1 and the second coupling capacitor C2 are adjusted by using the moving average detector 13a and the bias circuit 14a. A histogram w6 in FIG. 6 shows the fluctuations of the DC voltage level on the first signal path SL1 and the second signal path SL2 when the moving average detector 13a and the bias circuit 14a are not arranged. The range of fluctuations is narrower in the histogram w5 than the histogram w6. It can be thus understood that the fluctuations of the DC voltage level on the first signal path SL1 and the second signal path SL2 is curbed.

As described above, in the second embodiment, the moving average detector 13a detects the moving average of the number of 0s and the number of 1s in the digital signal outputted from the sampler 12. The charging current and the discharging current of the first coupling capacitor C1 and the second coupling capacitor C2 are controlled based on the detected moving average. Therefore, the fluctuations of the DC voltage level in the differential input signals on the first signal path SL1 and the second signal path SL2 are curbed.

Third Embodiment

Figure 7:
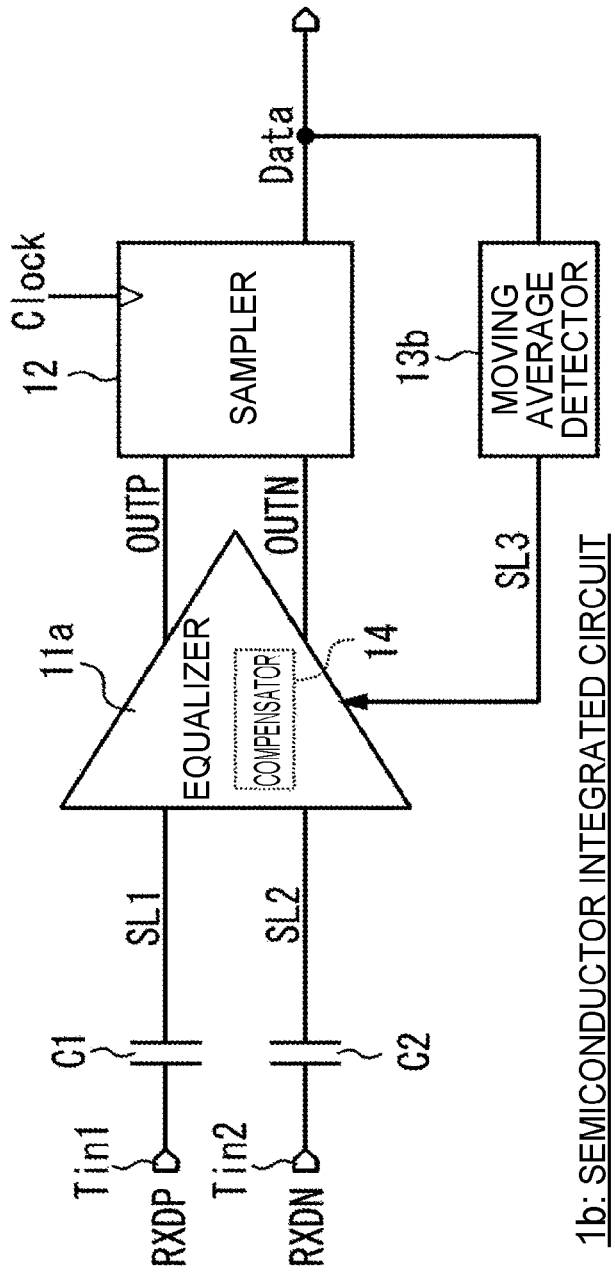
FIG. 7 is a block diagram illustrating a schematic configuration of a semiconductor integrated circuit according to a third embodiment.

In a third embodiment, the DC voltage level in an equalizer 11a is adjusted based on the output signal from a moving average detector 13b. FIG. 7 shows an example in which the compensator 14 is included in the equalizer 11a.

FIG. 7 is a block diagram illustrating a schematic configuration of a semiconductor integrated circuit 1b according to the third embodiment. The semiconductor integrated circuit 1b shown in FIG. 7 includes the moving average detector 13b instead of the detector 13, like the second embodiment. However, the moving average detector 13b differs from the moving average detector 13a of the second embodiment in that its output signal is inputted to the equalizer 11a. In the semiconductor integrated circuit 1b shown in FIG. 7, the output signal of the moving average detector 13b is inputted to the equalizer 11a. The configuration of the equalizer 11a may be the same as that shown in FIG. 2, for example. More specifically, an output signal SL3 from the moving average detector 13b is inputted to the gates of the transistors Q2 and Q4 as shown in FIG. 2. The current flowing between the drain and the source of each of the transistors Q2 and Q4 is adjusted according to the output signal from the moving average detector 13b. As a result, the DC voltage level of the differential output signals outputted from the first output node OUTP and the second output node OUTN connected to the drains of the transistors Q1 and Q3 are adjusted.

As described above, in the third embodiment, the DC voltage level in the equalizer 11a is adjusted based on the moving average of the number of 0s and the number of 1s in the digital signal, and therefore the DC voltage level of the differential output signals outputted from the equalizer 11a may be caused to approach the desired level.

Fourth Embodiment

In a fourth embodiment, the offset voltage of the differential output signals outputted from the equalizer 11 is adjusted by using a moving average detected by a moving average detector 13c.

Figure 8:
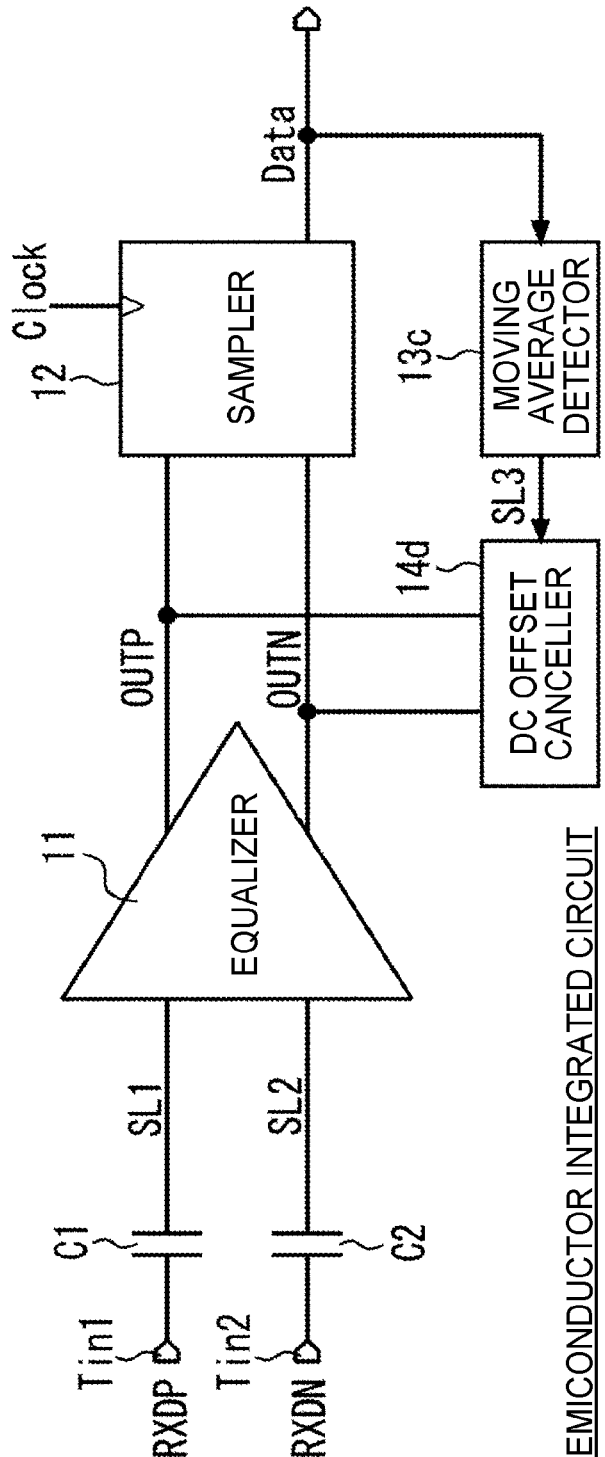
FIG. 8 is a block diagram illustrating a schematic configuration of a semiconductor integrated circuit according to a fourth embodiment.

FIG. 8 is a block diagram illustrating a schematic configuration of a semiconductor integrated circuit 1c according to the fourth embodiment. The semiconductor integrated circuit 1c in FIG. 8 includes the moving average detector 13c instead of the detector 13, like the second and the third embodiment, and a DC offset canceller (offset adjustment circuit) 14d instead of the compensator 14.

The DC offset canceller 14d is provided to cancel the offset voltage of the differential output signals outputted from the equalizer 11. The DC offset canceller 14d in the fourth embodiment adjusts the offset voltage of the differential output signals according to the moving average detected by the moving average detector 13c. More specifically, the DC offset canceller 14d of the fourth embodiment is provided not only for cancelling the offset voltage of the differential output signals but also for suitably adding an offset voltage to the differential output signals according to the moving average of the number of 0s and the number of 1s in the digital signal. When the DC voltage level of the differential input signals on the first signal path SL1 and the second signal path SL2, which are inputted to the equalizer 11, is shifted from an ideal level, and therefore an offset voltage occurs in the differential output signals, the offset voltage of the differential output signals outputted from the equalizer 11 is adjusted to reduce the offset voltage.

As described above, in the fourth embodiment, the offset voltage of the differential output signals outputted from the equalizer 11 is adjusted according to the moving average of the number of 0s and the number of 1s in the digital signal outputted from the sampler 12. Thus, the shift of the DC voltage level in the differential input signals inputted to the equalizer 11 may be adjusted by the offset voltage. In the fourth embodiment, the DC offset canceller 14d for cancelling the offset voltage of the differential output signals is also used to adjust the offset voltage of the differential output signals. Therefore, the shift of the DC voltage level in the differential input signals may be compensated for with a simple configuration.

The aspects of the disclosure are not limited to the embodiments described above, but may include various modifications that those skilled in the art may conceive. The effects of the disclosure are not limited to those in the above descriptions, either. Thus, various additions, modifications, and partial omissions may be made without departing from the conceptual spirit and scope of the disclosure derived from the claimed inventions and their equivalents.

The invention claimed is:

1. A semiconductor integrated circuit comprising:
   an equalizer circuit configured to amplify a signal component in a particular frequency band of an input signal on a signal path after a coupling capacitor;
   a sampler circuit configured to convert a first signal outputted from the equalizer circuit to a digital signal;
   a detector circuit configured to output a second signal indicating whether the numbers of two values included in the digital signal are balanced; and
   a compensator circuit configured to compensate for a shift of a DC voltage level on the signal path after the coupling capacitor based on the second signal outputted from the detector circuit.

2. The semiconductor integrated circuit according to claim 1, wherein the second signal is indicative of a difference between the number of 0s and the number of 1s in the digital signal.

3. The semiconductor integrated circuit according to claim 2, wherein the second signal is indicative of a moving average of the number of 0s and the number of 1s in the digital signal.

4. The semiconductor integrated circuit according to claim 1, wherein the compensator circuit is configured to adjust the DC voltage level on the signal path after the coupling capacitor based on the second signal.

5. The semiconductor integrated circuit according to claim 4, wherein the compensator circuit comprises a bias circuit configured to control a charging current or a discharging current of the coupling capacitor based on the second signal.

6. The semiconductor integrated circuit according to claim 4, further comprising a first input terminal and a second input terminal to which differential input signals are inputted,
wherein
the coupling capacitor comprises:
a first coupling capacitor disposed on a first signal path connected to the first input terminal; and
a second coupling capacitor disposed on a second signal path connected to the second input terminal,
wherein
the equalizer circuit comprises:
a first input node connected to the first signal path;
a second input node connected to the second signal path; and
a first output node and a second output node configured to output differential output signals, as the first signal, obtained by amplifying the differential input signals,
wherein
the sampler circuit is configured to output the digital signal corresponding to data included in the differential output signals in synchronization with a clock signal included in the differential output signals, and
wherein
the compensator circuit is further configured to adjust a DC voltage level on a path between the first coupling capacitor and the first input node on the first signal path and a DC voltage level on a path between the second coupling capacitor and the second input node on the second signal path based on the second signal.

7. The semiconductor integrated circuit according to claim 1, wherein:
the equalizer circuit comprises an adjustment node for adjusting a DC voltage level of the first signal; and
the second signal is inputted to the adjustment node.

8. The semiconductor integrated circuit according to claim 1,
further comprising a first input terminal and a second input terminal to which differential input signals are inputted,
wherein
the coupling capacitor comprises:
a first coupling capacitor disposed on a first signal path connected to the first input terminal; and
a second coupling capacitor disposed on a second signal path connected to the second input terminal,
wherein
the equalizer circuit comprises:
a first input node connected to the first signal path;
a second input node connected to the second signal path;
a first output node and a second output node configured to output differential output signals, as the first signal, obtained by amplifying the differential input signals; and
an adjustment node for adjusting a DC voltage level of the differential output signals,
wherein
the sampler circuit is configured to output the digital signal corresponding to data included in the differential output signals in synchronization with a clock signal included in the differential output signals, and
wherein
the second signal is inputted to the adjustment node.

9. The semiconductor integrated circuit according to claim 1,
further comprising a first input terminal and a second input terminal to which differential input signals are inputted,
wherein
the coupling capacitor comprises:
a first coupling capacitor disposed on a first signal path connected to the first input terminal; and
a second coupling capacitor disposed on a second signal path connected to the second input terminal,
wherein
the equalizer circuit comprises:
a first input node connected to the first signal path;
a second input node connected to the second signal path; and
a first output node and a second output node configured to output differential output signals, as the first signal, obtained by amplifying the differential input signals, and
wherein
the compensator circuit comprises an offset adjustment circuit configured to adjust an offset voltage of the differential output signals based on the second signal.

10. The semiconductor integrated circuit according to claim 9, wherein the offset adjustment circuit is configured to perform a first adjustment operation to adjust the offset voltage of the differential output signals outputted from the equalizer circuit to be cancelled, and a second adjustment operation to adjust the offset voltage of the differential output signals based on the second signal.

11. The semiconductor integrated circuit according to claim 1, wherein the equalizer circuit comprises a continuous time linear equalizer (CTLE) circuit configured to linearly amplifies the signal component in the particular frequency band of the input signal on the signal path after the coupling capacitor.

12. The semiconductor integrated circuit according to claim 1, wherein the detector circuit is configured to output signal, as the second signal, indicating whether or not there is a difference in the frequency of appearance between the two values included in the digital signal.

13. The semiconductor integrated circuit according to claim 12, wherein the compensator circuit is configured to compensate for the shift of the DC voltage level on the signal path after the coupling capacitor when the difference in the frequency of appearance between the two values included in the digital signal is greater than a threshold value.

14. A receiver device comprising:
a coupling capacitor disposed on a signal path of a reception signal;
an equalizer circuit configured to amplify a signal component in a particular frequency band of the reception signal on the signal path after the coupling capacitor;
a sampler circuit configured to convert a first signal outputted from the equalizer circuit to a digital signal;

a decoder circuit configured to perform a decoding process based on the digital signal;

a detector circuit configured to output a second signal indicating whether the numbers of two values included in the digital signal are balanced; and a compensator circuit configured to compensate for a shift of a DC voltage level on the signal path after the coupling capacitor based on the second signal.

15. The receiver device according to claim 14, wherein the second, signal indicates a difference between the number of 0s and the number of 1s included in the digital signal.

16. The receiver device according to claim 14, wherein the compensator circuit is configured to adjust the DC voltage level on the signal path after the coupling capacitor based on the second signal.

17. The receiver device according to claim 16, further comprising a first input terminal and a second input terminal to which differential input signals are inputted, wherein the coupling capacitor comprises:

a first coupling capacitor disposed on a first signal path connected to the first input terminal; and a second coupling capacitor disposed on a second signal path connected to the second input terminal, wherein the equalizer circuit comprises:

a first input node connected to the first signal path;

a second input node connected to the second signal path; and a first output node and a second output node configured to output differential output signals, as the first signal, obtained by amplifying the differential input signals, wherein the sampler circuit is configured to output the digital signal corresponding to data included in the differential output signals in synchronization with a clock signal included in the differential output signals, and wherein the compensator circuit is further configured to adjust a DC voltage level on a path between the first coupling capacitor and the first input node on the first signal path and a DC voltage level on a path between the second coupling capacitor and the second input node on the second signal path based on the second signal.

18. The receiver device according to claim 14, wherein:

the equalizer circuit comprises an adjustment node for adjusting a DC voltage level of the first signal; and the second signal is inputted to the adjustment node.

19. The receiver device according to claim 14, further comprising a first input terminal and a second input terminal to which differential input signals are inputted, wherein the coupling capacitor comprises:

a first coupling capacitor disposed on a first signal path connected to the first input terminal; and a second coupling capacitor disposed on a second signal path connected to the second input terminal, wherein the equalizer circuit comprises:

a first input node connected to the first signal path;

a second input node connected to the second signal path; and a first output node and a second output node configured to output differential output signals, as the first signal, obtained by amplifying the differential input signals, and wherein the compensator circuit comprises an offset adjustment circuit configured to adjust an offset voltage of the differential output signals based on the second signal.

20. The receiver device according to claim 14, wherein the equalizer circuit comprises a continuous time linear equalizer (CTLE) circuit configured to linearly amplifies the signal component in the particular frequency band of the input signal on the signal path after the coupling capacitor.

* * * * *